(12) United States Patent
Deppe et al.

(10) Patent No.: US 7,405,441 B2
(45) Date of Patent: Jul. 29, 2008

(54) SEMICONDUCTOR MEMORY

(75) Inventors: Joachim Deppe, Dresden (DE);
Mathias Krause, Dresden (DE);
Christoph Andreas Kleint, Dresden (DE); Christoph Ludwig, Langebrück (DE); Jens-Uwe Sachse, Dresden (DE);
Günther Wein, Nittendorf (DE)

(73) Assignee: Infineon Technology AG, Munich (DE)

( * ) Notice: Subject to any disclaimer, the term of this patent is extended or adjusted under 35 U.S.C. 154(b) by 102 days.

(21) Appl. No.: 11/078,647

(22) Filed: Mar. 11, 2005

(65) Prior Publication Data

US 2006/0205148 A1  Sep. 14, 2006

(51) Int. Cl.
*H01L 29/788* (2006.01)

(52) U.S. Cl. .................. 257/314; 257/321; 257/324

(58) Field of Classification Search .......... 257/315, 257/314, 321, 324
See application file for complete search history.

(56) References Cited

U.S. PATENT DOCUMENTS

| | | | |
|---|---|---|---|
| 6,232,179 B1 * | 5/2001 | Sato | 438/257 |
| 6,335,554 B1 | 1/2002 | Yoshikawa | |
| 6,475,857 B1 * | 11/2002 | Kim et al. | 438/240 |
| 6,686,242 B2 | 2/2004 | Willer et al. | |
| 6,960,482 B2 | 11/2005 | Matsumoto et al. | |
| 2001/0016406 A1 * | 8/2001 | Pan et al. | 438/597 |
| 2006/0086970 A1 * | 4/2006 | Kim | 257/321 |

FOREIGN PATENT DOCUMENTS

| | | |
|---|---|---|
| CN | 1395322 | 2/2003 |
| CN | 1441480 | 9/2003 |
| CN | 1783513 | 6/2006 |

* cited by examiner

*Primary Examiner*—Michael Trinh
(74) *Attorney, Agent, or Firm*—Slater & Matsil, L.L.P.

(57) ABSTRACT

A non-volatile semiconductor memory (30) comprising a semiconductor substrate (1) and a plurality of memory cells (19) and methods for manufacturing such a memory is provided. Each memory cell (19) comprises a charge-trapping element (5), a gate stack (20), nitride spacers (10) and electrically insulating elements (21). The charge-trapping element (5) is arranged on the semiconductor substrate (1) and comprises a nitride layer (3) sandwiched between a bottom oxide layer (2) and a top oxide layer (4), the charge-trapping element (5) having two lateral sidewalls (24) opposed to one another. The gate stack (20) is arranged on top of the charge-trapping element (5), the gate stack having two lateral sidewalls (25) opposing one another. The electrically insulating elements (21) are disposed at opposing sidewalls (24) of the charge-trapping element (5) and cover the sidewalls (24) of the charge-trapping element (5). The nitride spacers (10) cover the electrically insulating elements (21) and are arranged on opposing sidewalls (25) of the gate stack (20) and on the electrically insulating elements (21).

13 Claims, 8 Drawing Sheets

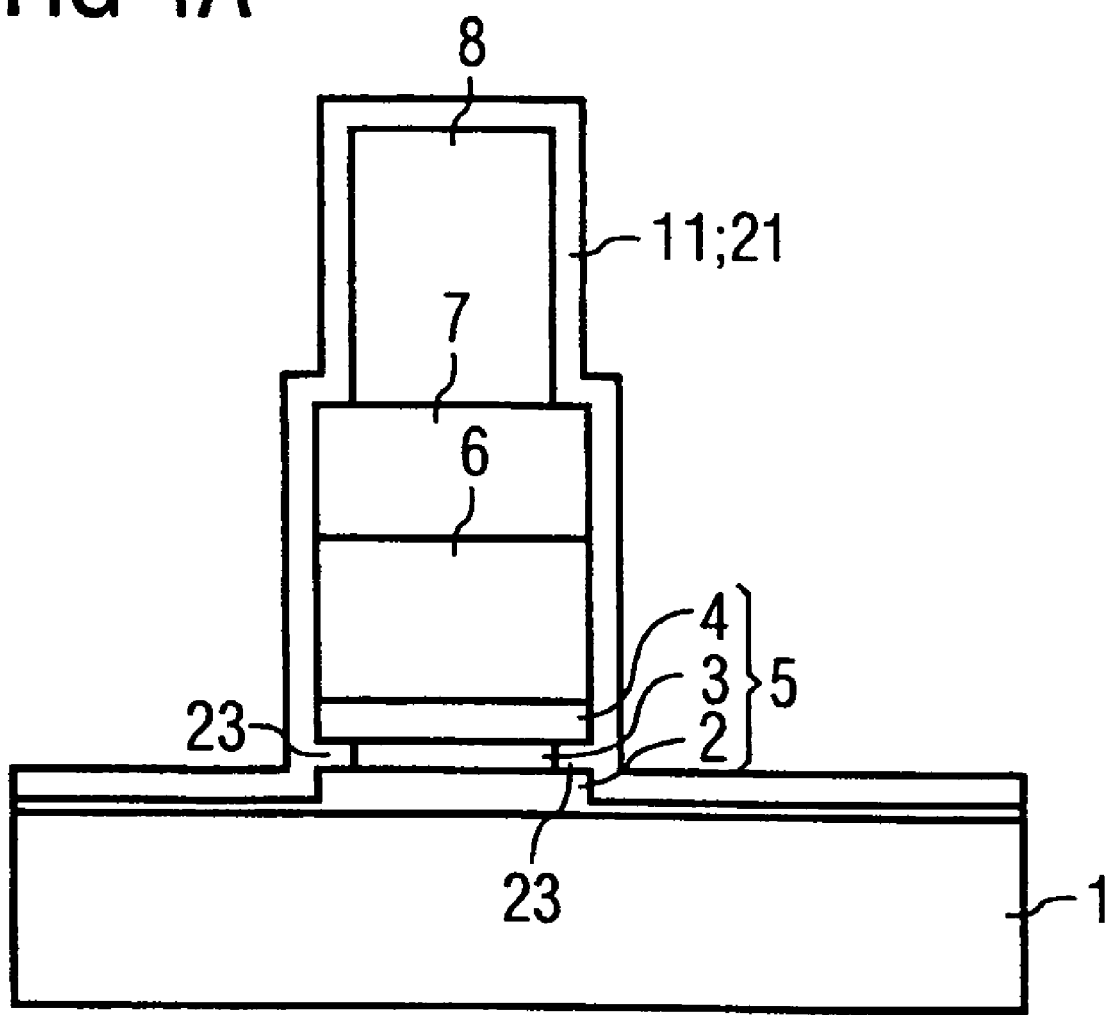

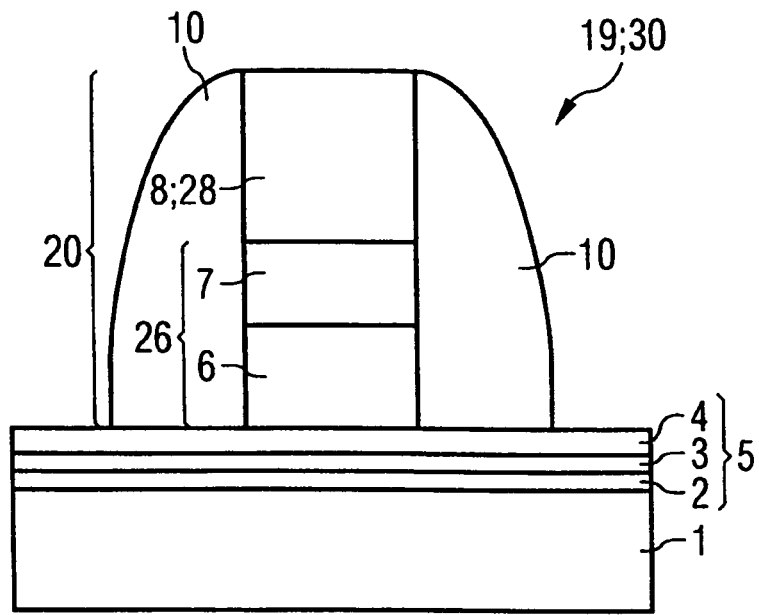
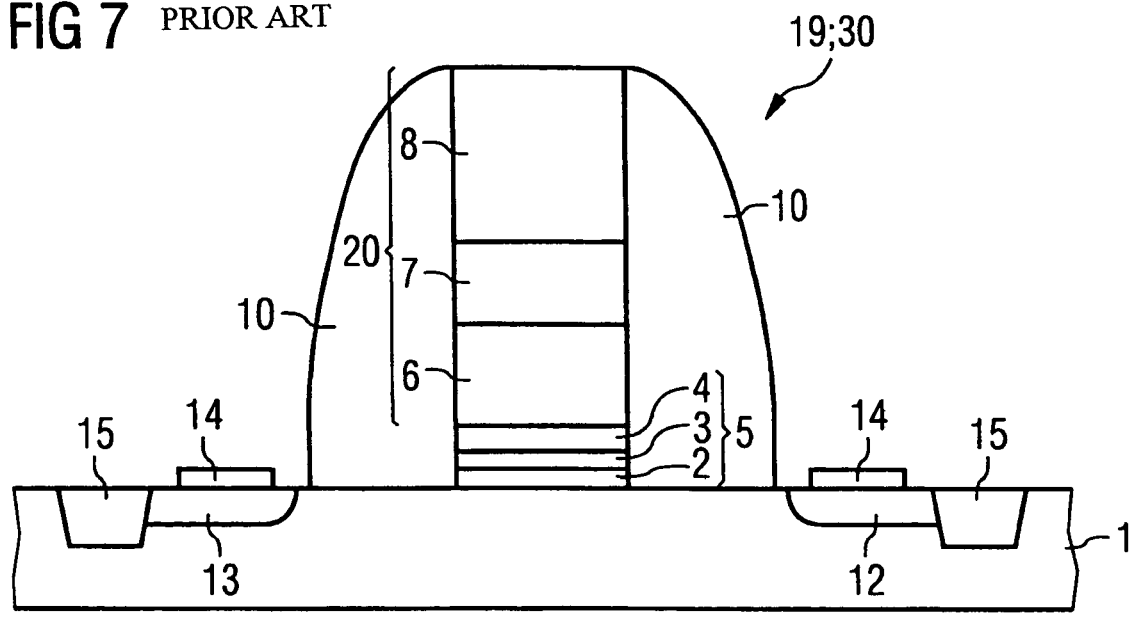

SEMICONDUCTOR MEMORY

TECHNICAL FIELD

The present invention relates to non-volatile semiconductor memory and to a method for the manufacture of such memories.

BACKGROUND

Integrated semiconductor memories such as flash memories have a storage capacity that can be increased, inter alia, by increasing the number of bits stored per memory cell. Nitride programmable read only memory (NROM) cells can store two bits per cell and are based on charge-trapping in a nitride layer of an ONO (oxide-nitride-oxide) gate dielectric. In order to store two bits per cell, charge is localized in two regions of the nitride layer of each cell and the charge stored in each region can be manipulated independently.

FIG. 7 shows a schematic cross-sectional view of an NROM cell 19. Arranged on top of a semiconductor substrate 1 is a charge-trapping element 5 and a gate stack 20 formed of a polysilicon layer 6, a tungsten silicide layer 7 and a cap nitride layer 8. Nitride spacers 10 are formed on both sidewalls of the charge-trapping element 5 and of the gate stack 20. A drain region 12 and a source region 13 of the memory cell 19 are also shown together with their respective contacts 14. The memory cells 19 in a memory are isolated from each other by shallow trench isolations (STI) 15.

The polysilicon layer 6 and the tungsten silicide (WSi$_x$) layer 7 form the gate electrode 26 of the memory cell 19, which is connected by the word line for addressing the memory cell 19. As tungsten silicide has a significantly lower specific electrical resistivity than polysilicon, the electrical resistance of the word lines is reduced. Reducing the resistivity of the word line is especially important in large high-speed memories with long word lines.

The charge-trapping element 5 consists of a bottom oxide (SiO$_2$) layer 2, a nitride (Si$_3$N$_4$) layer 3 and a top oxide (SiO$_2$) layer 4 and is also known as an ONO structure. When a memory cell 19 is programmed by applying proper biases on the word line, the contacts 14 of drain region 12 and the source region 13, hot electrons are generated between the drain 12 and source 13 region and injected into the nitride layer 3 where the electrons are trapped.

The cap nitride layer 8 on top of the tungsten silicide layer 7 is used as a hard mask for etching the gate stack 20. For producing the nitride spacers 10, a conformal nitride layer is deposited on the sidewalls of the gate stack 20 and is then etched anisotropically in a direction perpendicular to the surface of the semiconductor substrate 1. The nitride spacers 10 are used for forming self-aligned contacts 14 for contacting the source region 13 and the drain region 12. They are also used for masking the regions of the source and drain implants.

NROM cells 19 with nitride spacers 10 made from silicon nitride (Si$_3$N$_4$) show poor electrical properties such as reduced charge retention after cycling tests.

SUMMARY OF THE INVENTION

Accordingly, aspects of the invention provide non-volatile semiconductor memories that overcome the above-mentioned disadvantages of the prior art devices. Aspects of the invention also provide methods for manufacturing such non-volatile semiconductor memories.

The preferred embodiment of the invention therefore provides a non-volatile semiconductor memory comprising a semiconductor substrate and a plurality of memory cells. Each memory cell comprises a charge-trapping element, a gate stack, nitride spacers and electrically insulating elements. The charge-trapping element is arranged on the semiconductor substrate and comprises a nitride layer sandwiched between a bottom oxide layer and a top oxide layer, the charge-trapping element having two lateral sidewalls opposed to one another. The gate stack is arranged on top of the charge-trapping element, the gate stack having two lateral sidewalls opposed to one another. The electrically insulating elements are disposed at opposed sidewalls of the charge-trapping element and cover the sidewalls of the charge-trapping element. The nitride spacers cover the electrically insulating elements, wherein the nitride spacers are arranged on opposed sidewalls of the gate stack and on the electrically insulating elements. The electrically insulating elements isolate the nitride layer from the nitride spacer and improve the electrical properties of the memory.

Preferably, the electrically insulating elements are conformal oxide layers. Such layers can be formed by a radical element based oxidation, which is also able to oxidize the nitride layer.

Preferably, in each memory cell the nitride layer comprises sidewalls, which are recessed with respect to sidewalls of the bottom oxide layer and of the top oxide layer, a recess being formed by the respective sidewall of the nitride layer and by portions of the bottom oxide layer and the top oxide layer laterally extending beyond the nitride layer. The recess can be used for electrically insulating the charge-trapping element from the nitride spacer by growing or depositing oxides inside the recess.

On each sidewall of the respective charge-trapping element the electrically insulating elements comprise a first oxide layer and a second oxide layer, meant in a sense of enumeration and not in a sense of temporal order. The first oxide layer covers a portion of a bottom surface of the top oxide layer and a sidewall of the top oxide layer. The second oxide layer covers a portion of a top surface of the bottom oxide layer and a sidewall of the bottom oxide layer. The first oxide layer and the second oxide layer abut to one another in the recess. In this way the nitride layer is covered by oxide layers so that no radical based oxidation process is required.

In the recess the first oxide layer has a first thickness and the second oxide layer has a second thickness and wherein the sum of the first thickness and the second thickness is equal to a thickness of the nitride layer in the recess. In this way all of the nitride layer is covered by oxide layers.

Alternatively, the electrically insulating elements can be inner spacers. These spacers are placed between the charge-trapping element and the nitride spacers.

Preferably, the inner spacers are made of one of an oxide or an oxynitride. In this way electrical insulation between the charge-trapping element and the nitride spacers is provided.

Embodiments of the invention further provide a non-volatile semiconductor memory comprising a semiconductor substrate and a plurality of memory cells. Each memory cell comprises a charge-trapping element, a gate stack and nitride spacers. The charge-trapping element is arranged on the semiconductor substrate and comprises a nitride layer sandwiched between a bottom oxide layer and a top oxide layer. The gate stack is arranged on top of the charge-trapping element, the gate stack having two lateral sidewalls opposing one another. Nitride spacers are formed on opposing sidewalls of the gate stack and on the top oxide layer and the charge-trapping element extends laterally beyond the nitride spacers. In this way the top oxide layer acts as an electrically insulating element and separates the charge-trapping element from the nitride spacers.

Preferably, the gate stack of the memory cell comprises a polysilicon layer, a tungsten silicide layer arranged on top of the polysilicon layer and a cap nitride layer arranged on top of the tungsten silicide layer. In this way the electrical conductivity of the gate electrode formed by the polysilicon and the tungsten silicide layer can be increased.

Preferably, the memory cells are nitride read only memory cells. In this way two bits can be stored per cell and the storage capacity of the memory increased.

Preferably, the semiconductor memory comprises shallow trench isolations insulating the memory cells from one another. In this way very compact isolations can be achieved so that the storage density of the memory is further increased.

Embodiments of the invention provide a method for fabricating a non-volatile semiconductor memory comprising the steps of providing a semiconductor substrate, depositing a bottom oxide layer on the semiconductor substrate, depositing a nitride layer on the bottom oxide layer, depositing a top oxide layer on the nitride layer, depositing at least one gate electrode layer on top of the nitride layer, depositing a cap layer on the at least one gate electrode layer. Then gate stacks are formed by patterning the cap layer and the at least one gate electrode layer in a first etching step, to form a plurality of gate electrodes. After this a charge-trapping element is patterned in a second etching step by etching the top oxide layer, the nitride layer and the bottom oxide layer, to expose sidewalls of the top oxide layer, the nitride layer and the bottom oxide layer. Following this, the sidewalls of the nitride layer are converted into an electrically insulating material and nitride spacers are formed at opposing sidewalls of the gate stack and of the charge-trapping element. Converting the sidewalls of the nitride layer into electrically insulating material provides the insulation required to insulate the charge-trapping element from the nitride layer.

Preferably, the step of converting sidewalls of the nitride layer involves using a special oxidation process. Such a special oxidation process may be a radical based or a wet oxidation process, which can oxidize nitride.

There is further provided a method for fabricating a non-volatile semiconductor memory comprising the steps of providing a semiconductor substrate, depositing a bottom oxide layer on the semiconductor substrate, depositing a nitride layer on the bottom oxide layer, depositing a top oxide layer on the nitride layer, depositing at least one gate electrode layer on top of the nitride layer, depositing a cap layer on the at least one gate electrode layer, forming gate stacks by patterning the cap layer and the at least one gate electrode layer in a first etching step, patterning a charge-trapping element in a second etching step by etching the top oxide layer, the nitride layer and the bottom oxide layer, thereby exposing sidewalls of the top oxide layer, the nitride layer and the bottom oxide layer, performing a third etching step thereby laterally recessing sidewalls of the nitride layer with respect to the sidewalls of the bottom oxide layer and the top oxide layer such that portions of a top surface of the bottom oxide layer and portions of a bottom surface of the top oxide layer are exposed and a recess is formed, forming electrically insulating elements on the sidewalls of the bottom oxide layer and of the top oxide layer and forming nitride spacers at opposing sidewalls of the gate stack and on the electrically insulating elements. The recess is filled or covered with electrically insulating elements, so that insulation can be achieved without having to use a radical based oxidation process.

Preferably, in the third etching step a recess of 5 to 20 nm in lateral direction parallel to the surface of the substrate is formed. Such a recess is deep enough to provide enough electrical insulation of the nitride layer from the nitride spacer.

Preferably, the third etching step is performed using one of hydrofluoric acid dissolved in ethylene glycol or hot phosphoric acid.

Preferably, the step of covering the sidewalls of the bottom oxide layer and of the top oxide layer with electrically insulating elements involves thermally oxidizing the sidewalls of the bottom oxide layer and of the top oxide layer. Thermal oxidation has the advantage of resulting in oxides with good electrical insulating properties.

Preferably, the thermal oxidation is performed at a temperature between about 850 and 1150° C.

Preferably, the step of thermally oxidizing the sidewalls comprises growing a first oxide layer on the bottom surface of the top oxide layer and growing a second oxide layer on the top surface of the bottom oxide layer until the first oxide layer abuts the second oxide layer and the recess is filled with the first oxide layer and with the second oxide layer. In this way the sidewalls of the nitride layer are totally covered by oxide without having to oxidize the nitride layer.

Alternatively, the step of forming electrically insulating elements on at least the sidewalls of the bottom oxide layer and of the top oxide layer comprises first depositing an oxide by low pressure chemical vapor deposition on the sidewalls of the gate stack and of the charge storing layer, the deposited oxide filling in the recess, and thereafter thermally oxidizing the at least one gate electrode layer to form a thermal oxide. By filling in the recess, the nitride spacer is again electrically insulated from the nitride layer.

Preferably, between the step of depositing an oxide by low pressure chemical vapor deposition and the step of thermally oxidizing the at least one gate electrode layer, the oxide deposited by low pressure chemical vapor deposition is removed from the sidewalls of the gate stack while maintaining the oxide in the recesses of the charge-trapping element. The removal of the oxide allows the use of alternative etching processes for etching the self-aligned contacts of the drain and source regions.

Alternatively, the step of forming electrically insulating elements on at least the sidewalls of the bottom oxide layer and of the top oxide layer comprises first thermally oxidizing the sidewalls of the at least one gate electrode layer to form an oxide, and then depositing an oxide by low pressure chemical vapor deposition on the sidewalls of the gate stack and of the charge storing layer, the deposited oxide filling the recess.

Preferably, after the step of depositing an oxide by low pressure chemical vapor deposition, the deposited oxide is removed from the cap layer while maintaining the deposited oxide in the recesses of the charge-trapping element.

Preferably, the oxide is removed from the gate stack using one of wet etching and reactive ion etching.

Embodiments of the invention further provide a method for fabricating a non-volatile semiconductor memory comprising the steps of providing a semiconductor substrate, depositing a bottom oxide layer on the semiconductor substrate, depositing a nitride layer on the bottom oxide layer, depositing a top oxide layer on the nitride layer, depositing at least one gate electrode layer on top of the nitride layer, depositing a cap layer on the at least one gate electrode layer, forming gate stacks by patterning the cap layer and the at least one gate electrode layer in a first etching step, forming nitride spacers at opposing sidewalls of the gate stack and on the top oxide layer. In this way electrical insulation of the nitride layer from the nitride spacers is achieved in a very simple way by the top oxide layer.

There is further provided a method for fabricating a non-volatile semiconductor memory comprising the steps of providing a semiconductor substrate, depositing a bottom oxide layer on the semiconductor substrate, depositing a nitride layer on the bottom oxide layer, depositing a top oxide layer on the nitride layer, depositing at least one gate electrode layer on top of the nitride layer, depositing a cap layer on the at least one gate electrode layer, forming gate stacks by patterning the cap layer and the at least one gate electrode layer in a first etching step, patterning a charge-trapping element in a second etching step by etching the top oxide layer, the nitride layer and the bottom oxide layer, thereby exposing sidewalls of the top oxide layer, the nitride layer and the bottom oxide layer, forming inner spacers at opposing sidewalls of the charge storing layer and of the gate stack, and forming nitride spacers at opposing sidewalls of the gate stack and on the inner spacers, where the nitride spacers cover the inner spacers. The inner spacers again provide electrical insulation of the nitride layer from the nitride spacers.

In the above methods the gate electrode layer is preferably formed by depositing a polysilicon layer on the top oxide layer and further depositing a tungsten silicide layer on top of the polysilicon layer.

Further, it is preferred that the step of depositing a cap layer involves depositing a cap nitride layer on top of the tungsten silicide layer.

It is to be understood that both the foregoing general description and the following detailed description are exemplary, and are intended to provide further explanation of the invention as claimed.

BRIEF DESCRIPTION OF THE DRAWINGS

The invention is described in more detail by way of non-limiting examples and with reference to the accompanying drawings, in which:

FIG. 4a illustrates a recess filled in by low pressure chemical vapor deposition;

FIG. 6 illustrates a sixth embodiment of the invention where the top oxide layer is used as an electrically insulating element; and FIG. 7 illustrates an NROM cell according to prior art.

Figure 1A:
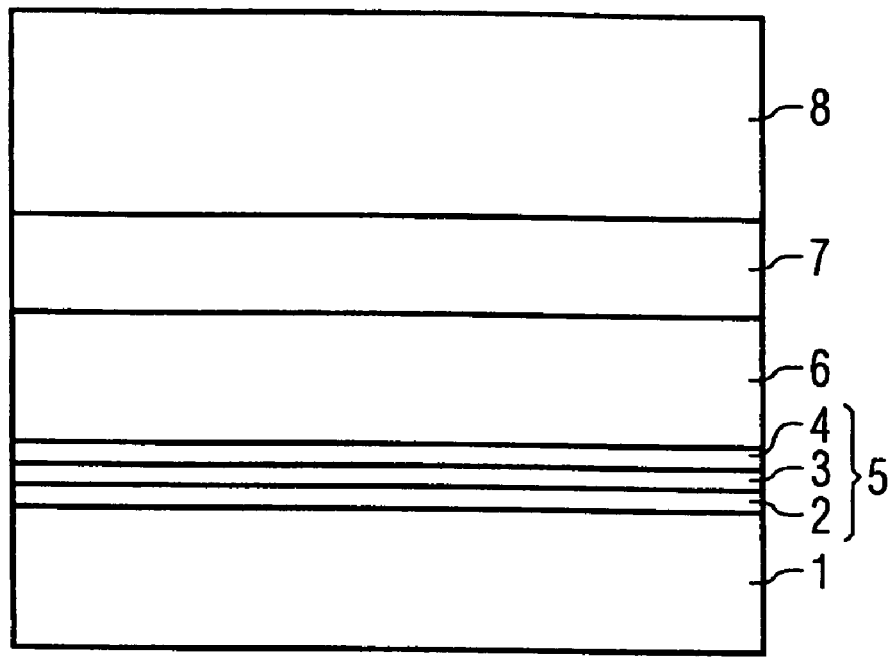
FIG. 1a illustrates a substrate and a stack of layers from which the embodiments of the invention are formed.

The following list of reference symbols can be used in conjunction with the figures:

1 semiconductor substrate
2 bottom oxide layer
3 nitride layer
4 top oxide layer
5 charge-trapping element
6 polysilicon layer
7 tungsten silicide layer
8 cap nitride layer
9 thermal oxide layer
10 nitride spacer
11 deposited oxide layer
12 drain region
13 source region
14 contacts of source/drain regions
15 shallow trench isolation
16 first oxide layer
17 second oxide layer
18 inner spacer
19 memory cell
20 gate stack
21 electrically insulating element
22 conformal oxide layer
23 recess
24 sidewalls of charge-trapping element
25 sidewalls of gate stack
26 gate electrode layer
28 cap layer
30 semiconductor memory
t1 thickness of first oxide layer
t2 thickness of second oxide layer
t3 thickness of nitride layer

DETAILED DESCRIPTION OF ILLUSTRATIVE EMBODIMENTS

Reference is now made to the figures, which are used to illustrate preferred embodiments of the invention. The drain region 12, the source region 13, the contacts 14 and the shallow trench isolations (STI) 15 of the memory cells shown in FIG. 7 are omitted in the figures illustrating the preferred embodiments of the invention. However, it is clear that these and other elements are needed to produce a memory cell and a semiconductor memory. Standard procedures such as the steps of implantation, cleaning, etc., are also not explicitly described.

FIGS. 1a to 1d show steps required for manufacturing a first embodiment of the invention. FIG. 1a shows a stack of layers arranged on a semiconductor body 1, such as a substrate or other semiconductor layer or region. A charge-trapping element 5 made up of a bottom oxide ($SiO_2$) layer 2, a nitride ($Si_3N_4$) layer 3 and top oxide ($SiO_2$) layer 4 is formed on top of the semiconductor substrate 1. A polysilicon layer 6 is deposited on the charge-trapping element 5 and a tungsten silicide ($WSi_x$) layer 7 is formed on top of the polysilicon layer 6. The gate electrode of the memory cell is formed from the polysilicon layer 6 and the tungsten silicide layer 7 and is part of a word line of the semiconductor memory. The tungsten silicide layer 7 is used to increase the conductivity of the word line. However, the invention can also be applied to memory cells without a tungsten silicide layer 7. Further, other silicide layers (e.g., titanium silicide, cobalt silicide, nickel silicide) or other conductors could be used instead of, or in addition to, the tungsten silicide layer 7. The topmost layer of the stack is the cap nitride layer 8, which, in the preferred embodiment, is made from nitride ($Si_3N_4$).

Figure 1B:
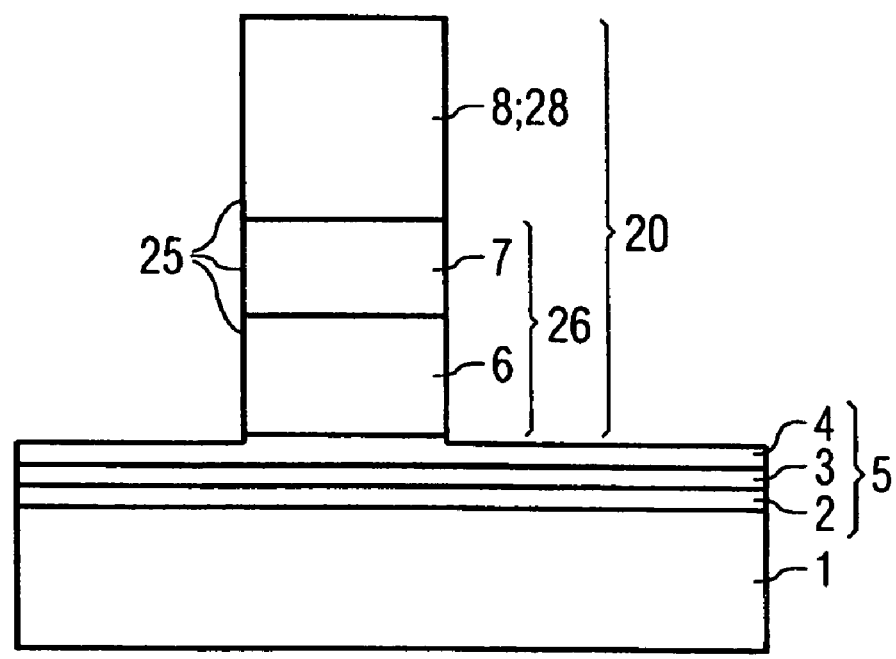
FIG. 1b illustrates a gate stack formed after performing an etching step.

FIG. 1b illustrates a gate stack 20 that is formed by patterning the cap nitride layer 8, the tungsten silicide layer 7 and the polysilicon layer 6 in a first etching step. The first etching step stops in the top oxide layer 4, which acts as an etch stop.

Figure 1C:
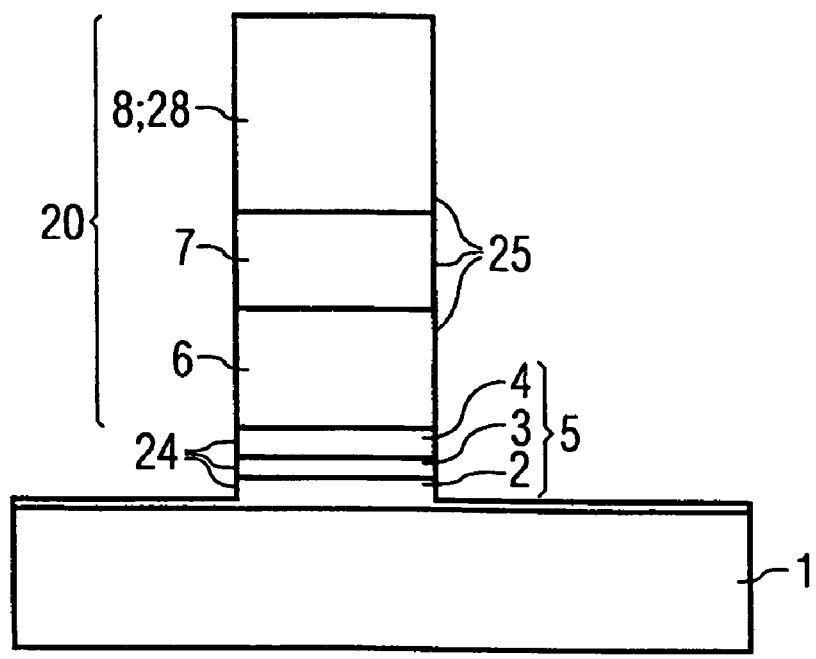
FIG. 1c illustrates a charge-trapping element formed after performing another etching step.

FIG. 1c illustrates the charge-trapping element 5 after performing a second etching step in which the top oxide layer 4, the nitride layer 3 and the bottom oxide layer 2 are patterned. Typically, the thickness of the bottom oxide layer 2 maintained on the semiconductor substrate 1 is between about 5 and 8 nm. The minimum thickness of the bottom oxide layer 2 after etching should be no less than 2 nm. The first and second etching steps can be combined into a single step if suitable processing equipment is available.

The structure shown in FIG. 1c forms the basis for all following embodiments of the invention except for the sixth embodiment, which is based on the structure shown in FIG. 1b. The embodiments differ from each other that the nitride layer 3 is separated and electrically insulated from the nitride spacers 10.

Figure 1D:
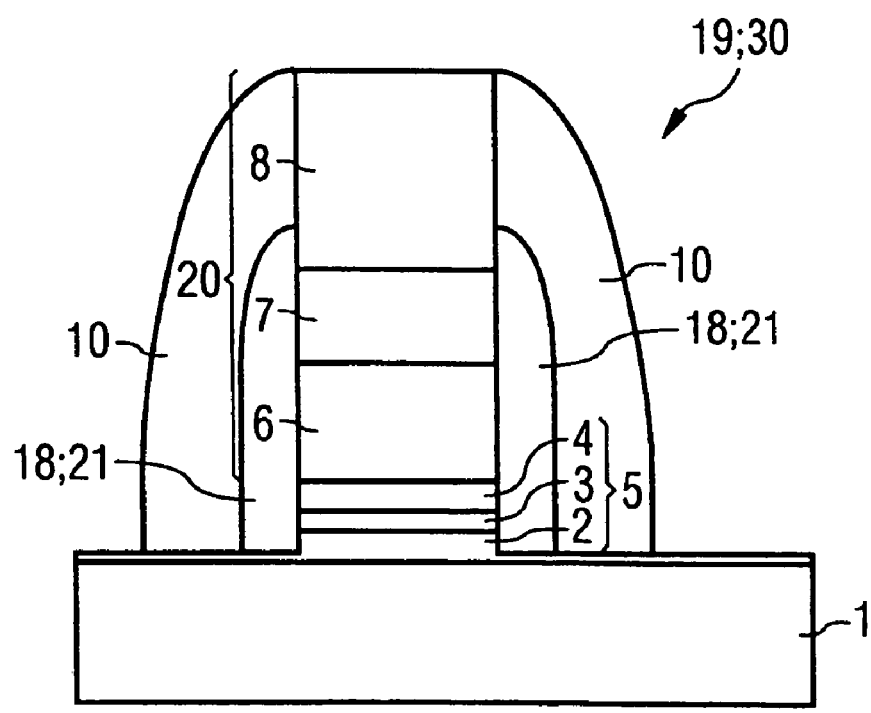
FIG. 1d illustrates a first embodiment of the invention with inner spacers.

FIG. 1d shows a first embodiment of a product according to the invention. Starting from the structure shown in FIG. 1c, electrically insulating elements 21 in the form of inner spacers 18 are formed on the sidewalls of the gate stack 20 and of the charge-trapping element 5. They cover at least the sidewalls of the charge-trapping element 5 and may also be in contact with the sidewalls of the polysilicon layer 6, tungsten silicide layer 7 and cap nitride layer 8, as shown in the figure. The inner spacers 18 are formed on top of the bottom oxide layer 2 and may be produced using a standard deposition process followed by an anisotropic etching step. The inner spacers 18 are made from electrically insulating material, such as oxide or oxynitride and have a thickness of typically 10 to 20 nm, the minimum thickness for sufficient electrical insulation of the nitride layer 3 from the nitride spacer 10 being 3 nm.

Nitride spacers 10 are formed on and cover the inner spacers 18. The inner spacers 18 can also be formed by any combination of suitable processes, such as for example, first oxidizing the sidewalls using a radical based or wet oxidation process followed by a deposition process. An alternative method for electrically insulating the nitride layer 3 from the nitride spacers 10 without using additional inner spacers 18 is to add oxide or oxynitride elements to the material of the nitride spacers 10.

Using inner spacers 18 or adding oxide or oxynitride elements to the nitride spacer material in order to improve the electrical properties of the memory cell has several disadvantages. First, when using inner spacers 18 the etch selectivity of such spacers is reduced when etching the contact holes for the contacts of the drain and source regions. Further, the complexity of the fabrication process is increased compared to that of a spacer made from nitride only. The increased complexity leads to greater variations in process and electrical parameters. Further embodiments of the invention that overcome these problems are now presented.

Figure 2:
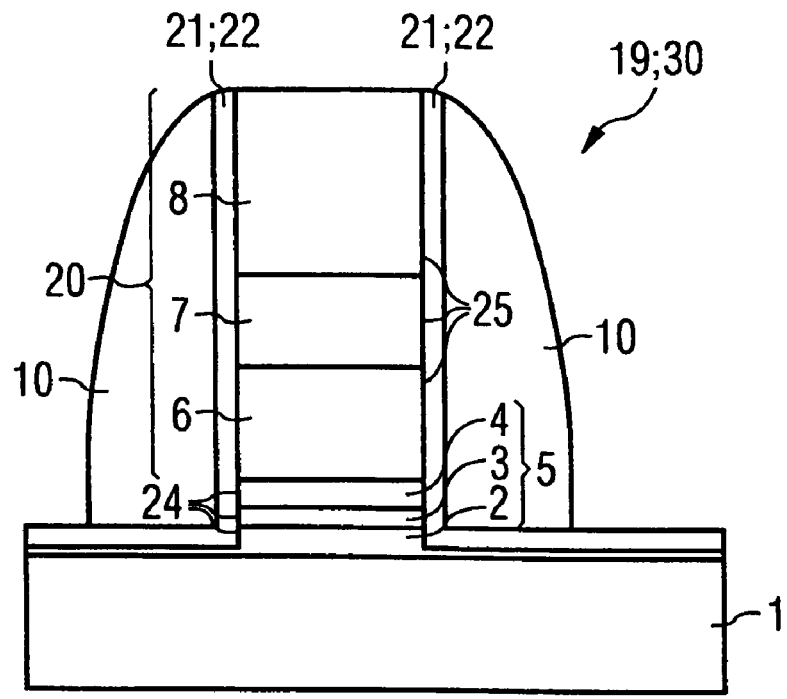
FIG. 2 illustrates a second embodiment of the invention with conformal oxide layers.

Reference is now made to FIG. 2, which shows a second embodiment of the invention. Starting again from the structure shown in FIG. 1c, an electrical insulating element 21 in the form of an oxide layer 22 is produced. The oxide layer 22 covers at least the sidewalls 24 of the charge-trapping element 5, but can also cover the sidewalls 25 of the polysilicon layer 6, of the tungsten silicide layer 7 and of the cap nitride layer 8 as well as covering the part of the bottom oxide layer 2 that was etched in the second etching step. As silicon nitride is extremely difficult to oxidize using standard oxidation processes, the invention uses a special oxidation process to convert the nitride of the sidewalls of the nitride layer 3 into oxynitride. The special oxidation process may be a radical element based oxidization process that uses oxygen radicals instead of oxygen molecules and involves rapid thermal oxidization (RTO) processes such as "in situ steam generation" (ISSG). After the oxidation of the sidewalls 24 of the charge-trapping element 5, of the sidewalls 25 of the polysilicon layer 6, the tungsten silicide layer 7 and the cap nitride layer 8, as well as the bottom oxide layer 2, a nitride spacer 10 is formed using the cap nitride 8 as a hard mask. In contrast to the first embodiment, there is no need to form an inner spacer 18 or to add oxides or oxynitrides to the nitride spacer 10 to electrically insulate the charge-trapping element 5 from the nitride spacer 10 as this insulation is achieved by the oxide layer 22. As a result, the complexity of the fabrication process is reduced.

FIGS. 3a-3d illustrate a third embodiment of the invention and show steps for manufacturing a product according to the embodiment.

The structure shown in FIG. 3a is again based on the structure shown in FIG. 1c. In a third etching step the sidewalls of the nitride layer 3 are etched on both sides. The recesses 23 formed are at least 1 nm, preferably 5 to 20 nm deep, measured from the sidewalls of the bottom oxide layer 2 and of the top oxide layer 4. The third etching step can involve using hot phosphoric acid ($H_3PO_4$) or hydrofluoric acid (HF) dissolved in ethylene glycol. In the third etching step the sidewalls of the cap nitride layer 8 can also be etched, as shown in the FIG. 3a.

The reason for etching the sidewalls of the nitride layer 3 in the third etching step is that standard thermal oxidation or low pressure chemical vapor deposition (LPCVD) processes can be used to fill the recesses 23 with oxides that electrically insulate the charge-trapping element 5 from the nitride spacers 10. There is no need for special oxidation processes such as radical element based oxidation as described in the second embodiment.

Figure 3A:
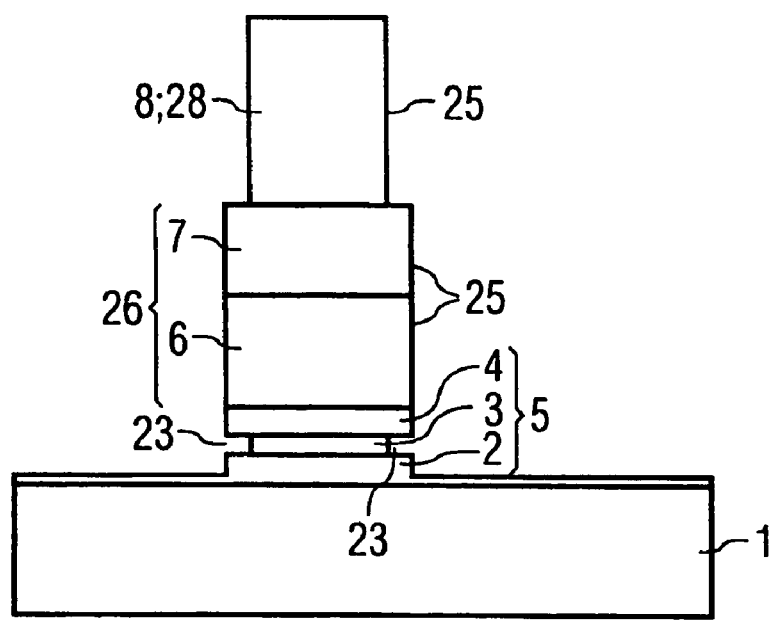
FIG. 3a illustrates a recess formed by etching into the charge-trapping element.

The structure shown in FIG. 3a forms the basis for the following third, fourth and fifth embodiments of the invention.

Figure 3B:
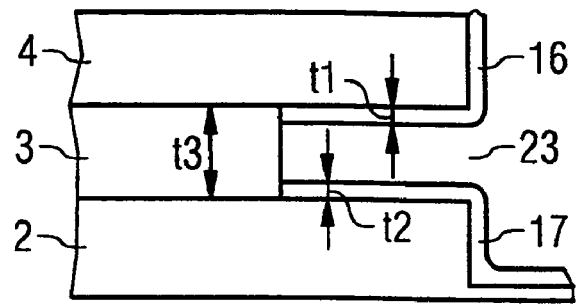
FIGS. 3b and 3c illustrate the growth of thermal oxide on the surfaces of the recess.
Figure 3C:
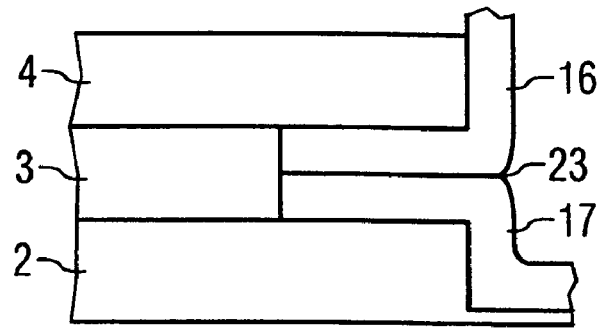

FIGS. 3b and 3c illustrate how the recess 23 created in the third etching step is used with a standard thermal oxidation process for electrically insulating the nitride layer 3 from the nitride spacers 10.

In FIG. 3b, an enlargement of the recess 23 formed on the right hand side of the charge-trapping element 5 in FIG. 3a is shown. The recess 23 is defined by the top surface of the bottom oxide layer 2, the bottom surface of the top oxide layer 4 and the sidewalls of the nitride layer 3. Using a standard thermal oxidation process, a first oxide layer 16 and a second oxide layer 17 are grown on the bottom surface of the top oxide layer 4 and on the top surface of the bottom oxide layer 2, respectively. In the recess 23 the thickness of the first oxide layer 16 is t1, the thickness of the second oxide layer 17 is t2 and the thickness of the nitride layer 3 is t3. As the first oxide layer 16 and second oxide layer 17 continue to grow in thickness, the oxide layers 16, 17 will eventually touch as is illustrated in FIG. 3c. This will happen if the sum of thicknesses of the first 16 and the second oxide layer 17 is equal to the thickness t3 of the nitride layer 3, which typically is about 7 nm. As can be seen in FIG. 3c the oxide layers 16, 17 fill the recess 23 and provide an electrical insulation of the nitride layer 3.

Figure 3D:
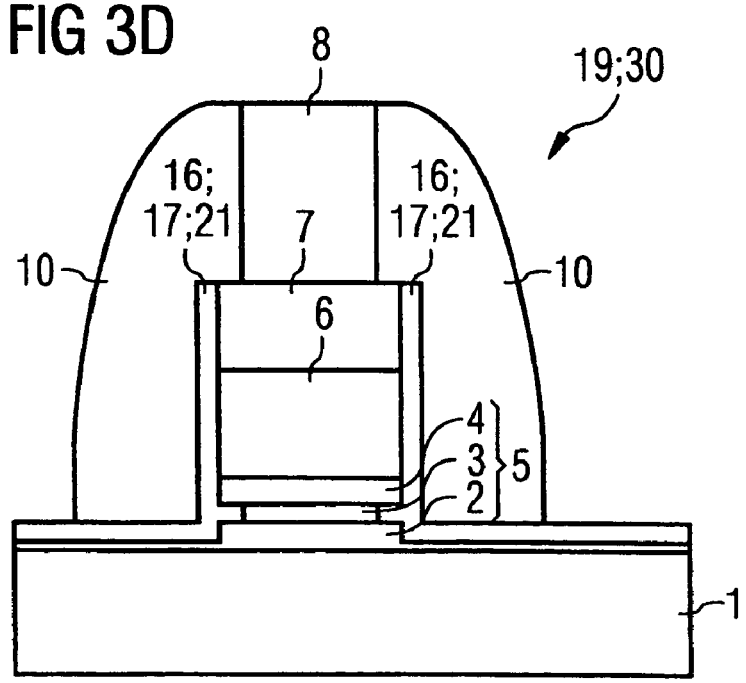
FIG. 3d illustrates a third embodiment of the invention with thermal sidewall oxidation.

FIG. 3d shows that the first oxide layer 16 not only covers the sidewalls of the charge-trapping element 5 but can also cover the sidewalls of the polysilicon layer 6 and the tungsten silicide layer 7. Similarly, the second oxide layer 17 can also cover the sidewalls of the bottom oxide layer 2 and the part of the bottom oxide layer 2 that was etched in the second etching step. The first 16 and second oxide layers 17 preferably have thicknesses of 3 to 20 nm on the sidewalls of the charge-trapping layer and of the gate stack and are produced by thermal oxidation at a temperature between about 850 and 1150° C. Following the thermal oxidation, nitride spacers 10 are formed using standard spacer techniques. In contrast to the first embodiment, there is no need for inner spacers 18 and no oxide or oxynitride elements need to be added to the nitride spacer 10 material. The nitride spacers 10 can be made of silicon nitride, which reduces the number of process steps, allows for higher etch selectivity when etching the contact holes for drain and source regions and reduces process instabilities and electrical parameter variations. The cap nitride layer 8 protects the gate stack when forming the nitride spacer 10. The memory cells 19 can be NROM cells and are isolated from each other by shallow trench isolations (STI) between them. The remaining steps required for producing a complete semiconductor memory are standard procedures known by those skilled in the art.

Figure 4B:
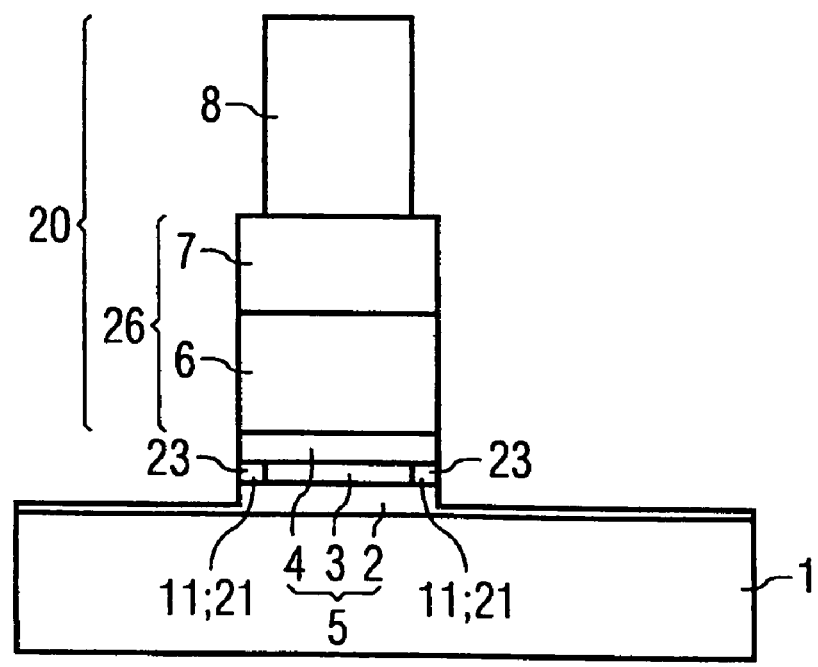
FIG. 4b illustrates the gate stack after removal of oxide deposited by low pressure chemical vapor.
Figure 4C:
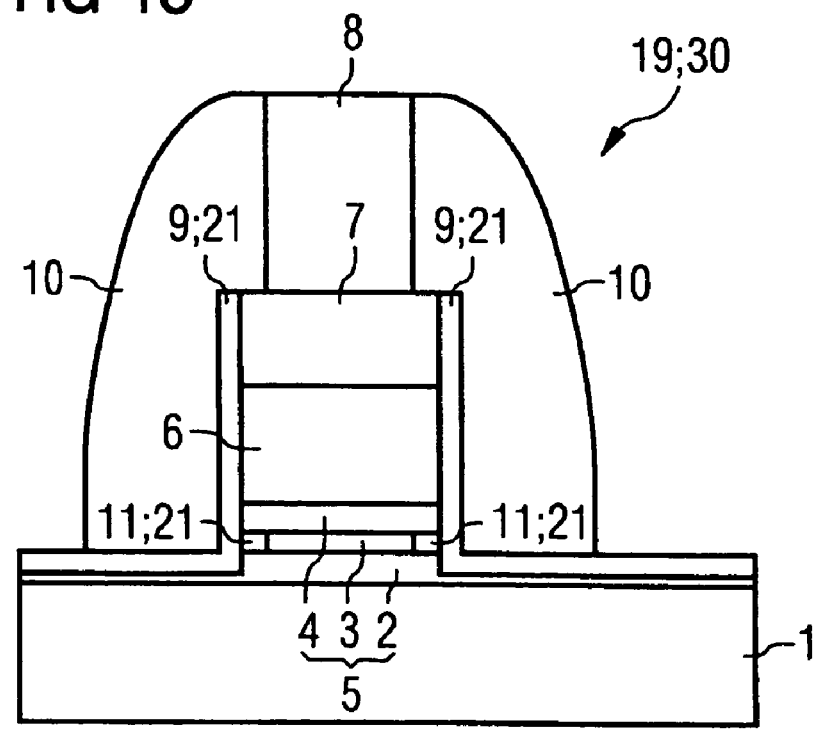
FIG. 4c illustrates a fourth embodiment of the invention in which low pressure chemical vapor deposition is followed by thermal sidewall oxidation.

A fourth embodiment of the invention also starts from the structure shown in FIG. 3a and is illustrated in FIGS. 4a-4c. In this embodiment, the sidewalls of the charge-trapping element 5, polysilicon layer 6 and tungsten silicide layer 7 are covered with electrically insulating elements 21 in three steps. The first step is illustrated in FIG. 4a in which a low pressure chemical vapor deposition (LPCVD) process is used to deposit an oxide layer 11 on the sidewalls of the charge-trapping element 5, of the polysilicon layer 6, of the tungsten silicide layer 7 and of the cap nitride layer 8, as well as on the top of the cap nitride layer 8 and on the part of the bottom oxide layer 2 that was etched in the second etching step. The recesses 23 are filled with the deposited oxide 11. The deposited oxide layer 11 is between 5 and 20 nm thick.

In a next step portions of the deposited oxide layer 11 are removed using wet etch or reactive ion etching (RIE) technology. FIG. 4b shows the result in which only the recesses 23 of the charge-trapping element 5 remain filled with the deposited oxide layer 11. Since stopping the etching step precisely at this point is difficult, usually a thin layer of the deposited oxide layer 11 is left on the other structures. For clarity's sake this thin layer is not shown in FIGS. 4b and 4c.

Following this step the sidewalls of the charge-trapping element 5, of the polysilicon layer 6 and of the tungsten silicide layer 7 are thermally oxidized, thereby producing a thermal oxide layer 9 as shown in FIG. 4c. In the same step the part of the bottom oxide 2 that was etched in the second etching step is also oxidized. During the thermal oxidation, defects in the deposited oxide layer 11 produced by LPCVD are healed. The thickness of the thermally produced oxide layer 9 is typically 3 to 20 nm. Nitride spacers 10 are added as described in previous embodiments.

Figure 5A:
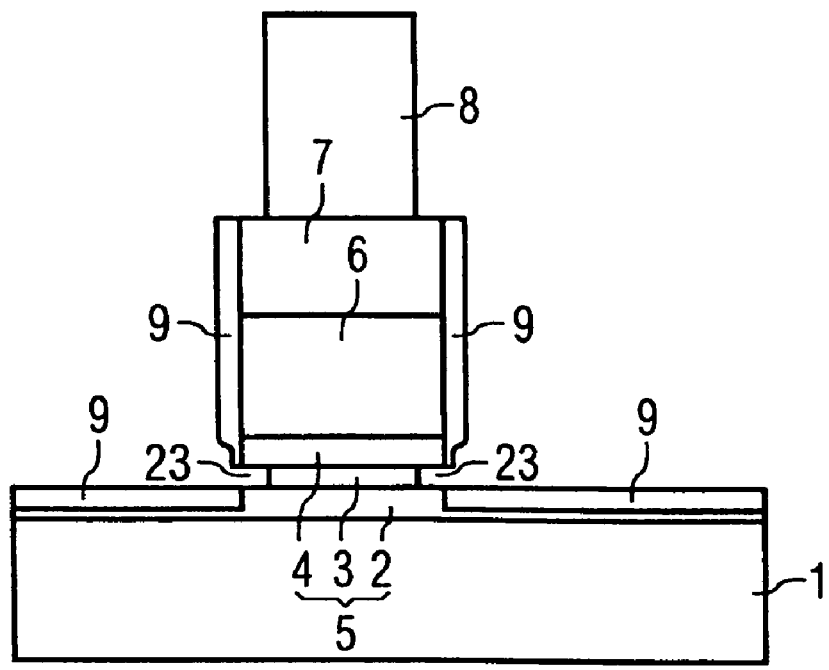
FIG. 5a illustrates a gate stack of which parts are thermally oxidized.
Figure 5B:
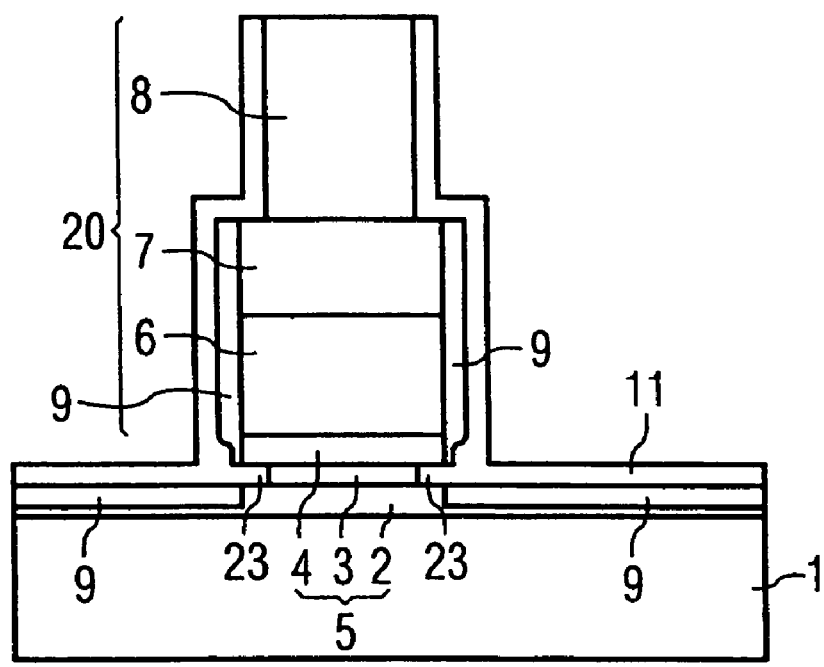
FIG. 5b illustrates a recess filled in by low pressure chemical vapor deposition.

A fifth embodiment again starts from the structure shown in FIG. 3a and is illustrated in FIGS. 5a and 5b. Similar to the fourth embodiment the electrically insulating elements 21 are produced in three steps. In the first step the sidewalls of the polysilicon layer 6 and tungsten silicide layer 7 are thermally oxidized to produce a thermal oxide layer 9 as shown in FIG. 5a. In the same step the sidewalls of the top oxide layer 4 and of the bottom oxide layer 2, as well as the part of the bottom oxide layer 2 that was etched in the second etching step are also oxidized. In a second step an oxide 11 is deposited using a low pressure chemical vapor deposition (LPCVD) process to cover all of the sidewalls including the thermal oxide layer 9. This step is illustrated in FIG. 5b. The thicknesses of the oxide layers 9 and 11 are the same as in the fourth embodiment of the invention. The deposited oxide 11 fills in the recesses 23 and so insulates the charge-trapping element 5 from the surrounding nitride spacers 10. Following the deposition of oxide 11, part of this oxide is removed in a third step using wet etch or reactive ion etching (RIE) technology so that the cap nitride layer 8 is not covered by the oxide 11, as was already shown in FIG. 4c. To complete the embodiment, nitride spacers 10 are created and the necessary steps for completion of the cell and the semiconductor memory are performed. Depending on the process technology used for etching the self-aligned contacts, the step of removing the deposited oxide 11 from the cap nitride layer 8 may be omitted.

Etching the sidewalls of the nitride layer 3 to form a recess between the bottom 2 and top oxide layer 4 not only has the advantage of being able to use standard thermal oxidation or LPCVD processes to create electrically insulating elements 21 but also increases the distance of the nitride layer 3 from the surrounding nitride spacers 10. This results in better electrical insulation of the nitride layer 3 from the surrounding nitride spacers 10 and further improves the electrical properties of the memory cell 19.

A sixth embodiment is shown in FIG. 6, which is based on the structure shown in FIG. 1b. The top oxide layer 4 acts as an etch stop when etching the gate stack 20. After the first etching step at least 3 nm and typically 5 to 8 nm of the top oxide layer 4 are left. The nitride layer 3 and the bottom oxide layer 2 are not etched at all. The top oxide layer 4 acts as an electrically insulating element and electrically insulates the nitride layer 3 from the nitride spacers 10. The nitride spacers 10 are formed on the maintained part of the top oxide layer 4.

It will be apparent to those skilled in the art that various modifications and variation can be made of the device and method of the present invention without departing from the scope or the spirit of the invention. In view of the foregoing, it is intended that the present invention covers modifications and variations of this invention provided therefore within in the scope of the following claims and their equivalents.

What is claimed is:

1. A non-volatile semiconductor memory comprising:
   a semiconductor body;
   a charge-trapping element arranged over the semiconductor body, the charge-trapping element comprising a nitride layer sandwiched between a bottom oxide layer and a top oxide layer, the charge-trapping element having two lateral sidewalls opposed to one another;
   a recess disposed in the bottom oxide layer, wherein the recess does not expose a surface of the semiconductor body;
   a gate stack arranged over the charge-trapping element, the gate stack having two lateral sidewalls opposed to one another;
   electrically insulating elements disposed directly upon the opposing sidewalls of the charge-trapping element and covering the sidewalls of the charge-trapping element and only a portion of the sidewalls of the gate stack, the electrically insulating elements comprising inner spacers having a first thickness adjacent the charge-trapping element and smoothly tapering to an end having no thickness at a distance away from the charge-trapping element; and nitride spacers covering the electrically insulating elements, wherein the nitride spacers are arranged on opposing sidewalls of the gate stack and on the electrically insulating elements.

2. The semiconductor memory according to claim 1, wherein the electrically insulating elements comprise oxide layers.

3. The semiconductor memory according to claim 1, wherein the electrically insulating elements comprise inner spacers made of an oxide.

4. The semiconductor memory according to claim 1, wherein the electrically insulating elements comprise inner spacers made of an oxynitride.

5. The semiconductor memory according to claim 1, wherein the gate stack comprises a polysilicon layer, a silicide layer arranged over the polysilicon layer and a cap nitride layer arranged over the silicide layer.

6. The semiconductor memory according to claim 5, wherein the silicide layer comprises a tungsten silicide layer.

7. The semiconductor memory according to claim 6, further comprising shallow trench isolations insulating the nonvolatile memory device from another device.

8. The semiconductor memory according to claim 5, wherein the electrically insulating elements extend from a surface of the semiconductor body adjacent the charge-trapping element to completely cover sidewalls of the polysilicon layer and the silicide layer and only partially cover sidewalls of the cap nitride layer.

9. The semiconductor memory according to claim 8, wherein the cap nitride layer partially covers a top surface of the gate stack.

10. A semiconductor memory comprising:
a charge-trapping element arranged over a semiconductor body, the charge-trapping element comprising a nitride layer sandwiched between a bottom oxide layer and a top oxide layer, the charge-trapping element having two lateral sidewalls opposed to one another, wherein the nitride layer comprises sidewalls that are recessed with respect to sidewalls of the bottom oxide layer and of the top oxide layer, a first recess disposed on the respective sidewalls of the nitride layer wherein portions of the bottom oxide layer and the top oxide layer laterally extend beyond the nitride layer;
a second recess disposed in the bottom oxide layer, wherein the second recess is not disposed directly under the first recess, and wherein the second recess does not expose a surface of the semiconductor body;
a gate stack arranged over the charge-trapping element, the gate stack having two lateral sidewalls opposed to one another;
electrically insulating elements disposed directly upon the opposing sidewalls of the charge-trapping element and covering the sidewalls of the charge-trapping element and only a portion of the sidewalls of the gate stack, wherein the electrically insulating elements comprise oxide layers; and
nitride spacers covering the electrically insulating elements, wherein the nitride spacers are arranged on opposing sidewalls of the gate stack and on the electrically insulating elements.

11. The semiconductor memory according to claim 10, wherein on each sidewall of the charge-trapping element the electrically insulating elements comprise a first oxide layer and a second oxide layer, wherein:
the first oxide layer covers a portion of a bottom surface of the top oxide layer and a sidewall of the top oxide layer;
the second oxide layer covers a portion of a top surface of the bottom oxide layer and a sidewall of the bottom oxide layer; and
the first oxide layer and the second oxide layer abut to one another in the first recess.

12. The semiconductor memory according to claim 11, wherein in the first recess the first oxide layer has a first thickness and the second oxide layer has a second thickness and wherein the sum of the first thickness and the second thickness is equal to a thickness of the nitride layer in the first recess.

13. A semiconductor memory comprising:
a charge-trapping element arranged over a semiconductor body, the charge-trapping element comprising a nitride layer sandwiched between a bottom oxide layer and a top oxide layer, the charge-trapping element having two lateral sidewalls opposed to one another, wherein the nitride layer comprises sidewalls that are recessed with respect to sidewalls of the bottom oxide layer and of the top oxide layer,
a first recess disposed on the respective sidewalls of the nitride layer and by portions of the bottom oxide layer and the top oxide layer laterally extending beyond the nitride layer;
a second recess disposed in the bottom oxide layer, wherein the second recess is not disposed directly under the first recess, and wherein the second recess does not expose a surface of the semiconductor body;
a gate stack arranged over the charge-trapping element, the gate stack having two lateral sidewalls opposed to one another;
a thermal oxide layer disposed directly upon the opposing sidewalls of the top oxide of the charge-trapping element and covering the sidewalls of only a portion of the sidewalls of the gate stack, wherein the thermal oxide layer is thinner over the sidewalls of the top oxide than over the sidewalls of the gate stack;
a deposited oxide disposed directly upon the opposing sidewalls of the nitride layer and the bottom oxide layer of the charge-trapping element, wherein the deposited oxide also disposed over the thermal oxide layer; and
nitride spacers covering the electrically insulating elements, wherein the nitride spacers are arranged on opposing sidewalls of the gate stack and on the electrically insulating elements.

* * * * *

UNITED STATES PATENT AND TRADEMARK OFFICE
CERTIFICATE OF CORRECTION

| | | |
|---|---|---|
| PATENT NO. | : 7,405,441 B2 | Page 1 of 1 |
| APPLICATION NO. | : 11/078647 | |
| DATED | : July 29, 2008 | |
| INVENTOR(S) | : Deppe et al. | |

It is certified that error appears in the above-identified patent and that said Letters Patent is hereby corrected as shown below:

On the Title Page, Item (73) Assignee, delete "Technology" and insert --Technologies--.

Signed and Sealed this

Thirtieth Day of September, 2008

JON W. DUDAS
*Director of the United States Patent and Trademark Office*